United States Patent [19]

Petit et al.

[11] 4,450,533
[45] May 22, 1984

[54] DISTRIBUTED ARITHMETIC DIGITAL PROCESSING CIRCUIT

[76] Inventors: Jean-Pierre Petit, 16, rue Le Peletier, 22220 Treguier; Xavier Maitre, Rte. de Pennker, Le Bourg, 22300 Lannion, both of France

[21] Appl. No.: 293,367

[22] Filed: Aug. 17, 1981

[30] Foreign Application Priority Data

Aug. 27, 1980 [FR] France .................................. 80 18580

[51] Int. Cl.³ .............................................. G06F 15/31
[52] U.S. Cl. ..................................................... 364/724
[58] Field of Search ......................................... 364/724

[56] References Cited

U.S. PATENT DOCUMENTS

| | | | |
|---|---|---|---|
| 3,777,130 | 12/1973 | Croisier et al. ...................... | 364/724 |
| 4,146,931 | 3/1979 | Delforge ............................... | 364/724 |
| 4,337,518 | 6/1982 | Ohnishi et al. ....................... | 364/724 |

OTHER PUBLICATIONS

Tubiana, "Digital Filter" *IBM Tech. Disclosure Bulletin* vol. 17 No. 9 Feb. 1975 pp. 2656-2658.

Nun, "Versatile Digital Arithmetic Unit with RAMS" *Electronic Engineering* Jun. 1976, pp. 18–19.

*Primary Examiner*—David H. Malzahn
*Attorney, Agent, or Firm*—Anthony H. Handal

[57] ABSTRACT

Digital processing circuit forming a weighted sum of digital signals. It comprises n groups of M series registers ($10/1, \ldots, 10/nM$) into which are introduced the signals to be processed, n multiplexers ($15/1, 15/2, \ldots, 15/n$), a memory (20) containing precalculated quantities characteristic of the weighted sum to be formed, said memory having a capacity of $2^{\beta+n}$ words distributed into different blocks, a modulo M counter (25), an adder-subtracter (30) connected to the memory, an accumulator-register (40) connected to the adder-subtracter and a clock (50) actuating the counter and the registers. The circuit is in that the memory is subdivided into $[M-(2^\beta - M)]$ blocks of $2^n$ words and into $(2^\beta - M)$ blocks of $2^{n+1}$ words, said blocks being selected by the bits supplied to the outputs of the counter, in that it comprises supplementary series registers, whose number is at the most equal to $2\beta - M$, said series registers receiving the supplementary signals to be processed and in that it also comprises a multiplexing means (21) controlled by the outputs of the counter.

3 Claims, 5 Drawing Figures

DISTRIBUTED ARITHMETIC DIGITAL PROCESSING CIRCUIT

BACKGROUND OF THE INVENTION

1. Field of the Invention

The present invention relates to a distributed arithmetic digital processing circuit. It is used in the construction of digital filters, which can in particular be employed in telecommunications.

2. Description of the Prior Art

The digital processing performed by the circuit according to the invention is a weighted sum which can be expressed by the relation:

$$v = \sum_{k=1}^{p} a_k u_k \quad (1)$$

in which $u_k$ designates different digital signals of rank k and in which $a_k$ designates weighting coefficients.

A special case of such a processing is recursive digital filtering conventionally characterized by an expression of form:

$$y_n = \sum_{k=0}^{p} a_k x_{n-k} - \sum_{k=1}^{q} b_k y_{n-k} \quad (2)$$

in which $x_{n-k}$ designates the input signals of rank $n-k$, $y_{n-k}$ output signals of rank $n-k$ reinjected at the input of the filter, $a_k$ coefficients of the non-recursive part, whose order is p and $b_k$ coefficients of the recursive part, whose order is q, n assuming all the values and being an integer characterizing the rank of the output signal.

A recursive digital filter able to carry out such processing comprises $p+1$ inputs receiving the signals $x_k$ and q inputs receiving the signals $y_k$, i.e. in total $p+q+1$ inputs. It also comprises an output supplying the sequence of signals $y_n$.

The transfer function $H(z)$ of such a filter, expressed by means of the complex variable z, is:

$$H(z) = \frac{\sum_{k=0}^{p} a_k z^{-k}}{1 + \sum_{k=1}^{q} b_k z^{-k}} \quad (3)$$

The invention relates to a special technique for digital processing called "distributed arithmetic". The latter is described in U.S. Pat. No. 3,777,130 granted on Dec. 4th 1973 to A. Croisier, D. J. Estcban, M. E. Levilion and V. Riso and entitled "Digital filter for PCM encoded signals", as well as the article of A. Peled and B. Liu entitled "A new hardware realization of digital filters" published in the journal "IEEE Trans. on ASSP", vol. ASSP 22, pp. 456–462, December 1974. In addition, the article by C. S. Burrus entitled "Digital filter structures described by distributed arithmetic" published in the journal "IEEE Trans. on Circuits and Systems", vol. CAS-24, no. 12, December 1977, pp. 674–680 gives a general approach to this question and describes several algorithms and structures which can be used. Reference can be made to these documents for details concerning distributed arithmetic, which is only briefly described hereinafter in order to facilitate the understanding of the invention.

It involves effecting a weighted sum of the signals expressed by relation (1). It is assumed that the $u_k$ are coded on r bits in code complement to 2, but other codes are naturally possible. The sign bit is designated $u_k(0)$ and the bits representing the absolute value of $u_k$ are designated $u_k(j)$, j being between 0 (exclusive) and $r-1$ (inclusive). Thus, it is possible to write:

$$u_k = -u_k(0)2^0 + \sum_{j=1}^{r-1} u_k(j) 2^{-j} \quad (4)$$

if $-1 \leq u_k < 1$

Then, after inversion of the summations it is possible to write v in the form:

$$v = -2^0 \left( \sum_{k=1}^{p} u_k(0) a_k \right) + \sum_{j=1}^{r-1} 2^{-j} \left( \sum_{k=1}^{p} u_k(j) a_k \right) \quad (5)$$

In this relation the term $u_k(j)$ appearing in the bracketed expression is the bit of rank j of $u_k$ and this bit can only assume two values: 0 or 1. For the first product $u_1(j)a_1$ there are consequently only two possible values: 0 or $a_1$. In the same way for the product $u_2(j)a_2$ which can only assume the two values 0 and $a_2$ there are consequently only four possible values for the sum of these two products, namely 0, $a_1$, $a_2$, or $a_1+a_2$. Step by step it can be seen that there are finally $2^p$ possible values for the sum:

$$\sum_{k=1}^{p} u_k(j) a_k$$

This sum, designated $w_j$ (because it is dependent on the rank j in question) assumes any one of $2^p$ values determined solely by the coefficients $a_k$. Thus, the calculation of the weighted sum is a question of the calculation of the expression:

$$v = -2^0 w_0 + \sum_{j=1}^{r-1} w_j 2^{-j}$$

in which $w_j$ can be predetermined as soon as a set of coefficients $a_k$ has been fixed.

That of these $2^p$ values to be retained for forming $w_j$ is defined by all the p bits of rank j of the input signals, namely $u_1(j), u_2(j) \ldots u_p(j)$.

In a distributed arithmetic processing signal the quantities $w_j$ are entered in a memory of $2^p$ words of m bits, if m is the number of bits necessary for expressing these partial sums. The word corresponding to a particular $w_j$ is, in this memory, located at the address corresponding to p bits of rank j of input signals $u_k$.

The number m is determined on the basis of the constraints of the problem to be dealt with and can be deduced in two different ways: by truncation of the coefficients $a_k$ as in a conventional realization or by direct truncation of quantities $w_j$ (but then processing is no longer strictly linear). The latter method is described in the article of R. Lagadec and D. Pelloni entitled "A model for distributed arithmetic for filters with post-quantized look-up table" published in "National Telecommunication Conference" 1977, pp. 29: 3-1 to 29: 3-6.

If the input signals $u_k$ are introduced into series registers with a low weight at the head and if at the output of the memory containing the precalculated $w_j$ there is an arithmetic unit constituted by an adder-subtracter, an accumulator register with parallel inputs and parallel outputs which can be displaced it is possible to obtain the weighted sum v in r elementary operations such as the:

reading the memory at the address given by the p bits $u_k(j)$, addition of the content of the parallel-parallel accumulator register and the word contained in the memory at the indicated address (for j=0 it is necessary to subtract the content of the memory from the content of the register), shift of the parallel-parallel accumulator register and the input series registers (which corresponds to a division by two of the intermediate result).

The material organization of such a circuit is illustrated in FIG. 1. The represented circuit comprises p series registers 10/1, 10/2, . . . 10/p of r bits receiving the p input signals 20, a read-only memory of $2^p$ words of m bits, an adder-subtracter 30, a register with parallel inputs and parallel outputs 40, which can be shifted and a timing circuit 50.

The memory has p inputs connected to the outputs of p input registers and contains the $2^p$ following quantities:

$$\sum_{k=1}^{p} a_k \epsilon_k$$

in which $\epsilon_k$ assumes the values 0 or 1, the address of each quantity being constituted by p bits applied to the p inputs.

Using such means the equivalent of p multiplications and (p−1) additions can be performed in r clock strokes, the operation being performed in the following manner.

The quantities $u_k$ appear with a low head weight in the registers 10/1, . . . 10/p. The first quantity calculated is:

$$w_{r-1} = \sum_{k=1}^{p} u_k(r-1)a_k$$

then following the shift of register 40 $2^{-1}w_{r-1}$, $w_{r-2}$ is calculated and then the sum $w_{r-2}+2^{-1}w_{r-1}$, and then after a further shift $$2^{-1}(w_{r-2}+2^{-1}w_{r-1})=2^{-1}w_{r-2}+2^{-2}w_{r-1}$$

is calculated and so on up to the nth clock stroke where a subtraction corresponding to the sign bits $u_k(0)$ is performed. Following this final stroke the series registers 10/1 . . . 10/p must be shifted. It is also possible to truncate or round off result v. To effect this truncation it is merely necessary to not take account of the least significant bits as from a certain moment. For rounding off purposes it is necessary to add a low half-weight before truncating the results.

These principles can be applied to the realization of a recursive digital filter. The operation to be performed is then that of relation (2) and the corresponding circuit is that of FIG. 2. It comprises a non-recursive part constituted by p+1 series registers 10/0, 10/1 . . . 10/p receiving the signals $x_n, x_{n-1}, \ldots, x_{n-p}$ and a recursive part constituted by q registers 11/1, 11/2 . . . 11/q receiving the signals $y_{n-1}, y_{n-2}, \ldots y_{n-q}$, register 11/1 having parallel loading and the other registers series loading. The output of registers 10/0 and 10/p−1 is connected to the input of the following register, the same as with registers 11/1 to 11/q−1. The circuit also comprises a memory 20 with p+q+1 inputs connected to the output of the registers, said memory containing $2^{p+1+1}$ words of m bits, said words being the quantities:

$$\sum_{j=0}^{p} a_j \epsilon_{j+1} - \sum_{k=1}^{q} b_k \epsilon_{p+q+1-k}$$

in which $\epsilon_j$ are equal to 0 or 1, j passing from 1 to p+q+1.

Finally the circuit comprises the aforementioned arithmetic processing means, namely an adder-subtracter 30, an accumulator register 40 with parallel inputs and parallel outputs, as well as a timing circuit or clock 50 ensuring the appropriate performance of the operation (shifting registers, loading parallel registers, resetting the accumulator at the end of the cycle).

There are the two following modifications compared with the circuit of FIG. 1:

register 11/1 corresponding to $y_{n-1}$ has parallel loading, the content of the parallel-parallel register 40 must be limited to r bits (by truncation or rounding off), then at the end of each calculation cycle (r elementary operations) is loaded into register $y_{n-1}$ in parallel manner, the different series registers are interconnected.

The reading frequency of the memory and the shift of the registers is equal to $rf_E$ if $f_E$ is the sampling frequency of the digital filter. If the data $x_k$ enter the device in series form with a low weight at the head, at the correct speed and with the correct number r of bits the first register 10/0 is not indispensable. If it is retained with to some extent a buffer register function the result is delayed by one cycle $1/f_E$. In certain applications the data are in parallel form, so that the first register must then have parallel loading.

In such a device the size of the memory increases significantly as soon as the orders p and q of the filter reach values of approximately 6, corresponding to the "templates" necessary for the transmission of data by coded pulses (PCM).

One solution for reducing the size of the memory consists of using one or more multiplexers, but this increases the working frequency. M multiplexers can be located at the output of the memory, as described in the article by C. S. Burrus referred to hereinbefore. These multiplexers have M inputs and an output. Such a multiplexer is symbolized hereinafter by the notation M→1. It is controlled by a modulo M counter with β outputs receiving the pulses from the clock. The memory then comprises M different memories, each of $2^n$ words of m bits, said memories having n addressing inputs and an output. In all the circuit has nM input registers distributed into n groups, each associated with a memory. The size of the memory system is then $M.2^n$ words of m bits, which is below the size of $2^{nM}$ such as would occur with a single memory without multiplexers in order to be able to process nM input signals.

SUMMARY OF THE INVENTION

The present invention adopts a slightly different arrangement consisting of placing the multiplexers at the input of the memory and not at the output. This makes it possible to use a single memory (instead of M) and n multiplexers M→1 instead of m. The corresponding circuit is shown in FIG. 3. It comprises nM input registers distributed into n groups respectively 10/1, 10/2, . . . 10/M for the first group, 10/M+1, 10/M+2, . . . 10/2M for the second, etc. . . . , 10/nM−M+1, 10/nM−M+2, . . . , 10/nM for the last, a system of n multiplexers M→1, respectively 15/1, 15/2, . . . , 15/n, each of these multiplexers having M inputs connected to the outputs of the M registers of the corresponding group and one output, a memory with $2^{\beta+n}$ words of m bits. This memory is subdivided into $2^\beta$ blocks of $2^n$ words each. This memory has on the one hand $\beta$ inputs ($f_0, \ldots, f_{-1}$) for addressing one of the blocks and on the other hand n inputs $e_1, e_2, \ldots, e_n$ for addressing one word to the interior of a block. The latter inputs are connected to the outputs of n multiplexers. With regards to the first-mentioned they are connected to the $\beta$ outputs of a modulo M counter 25, which are also connected to the selection inputs 14/1, 14/2, . . . 14/n of the multiplexers. The counter receives pulses at the frequency $M.rf_E$ coming from clock 50. The circuit also comprises an adder-subtracter 30 and an accumulator register 40.

By comparison with FIG. 1 (with p=nM) it can be seen that the capacity of the memory is reduced from $2^{nM}$ to $2^{n+\beta}$, i.e. because M is in this case equal to $2^\beta$ a reduction from $2^{nM}$ to $M2^n$. This reduction takes place to the detriment of the number of operations from r to Mr.

The circuit operates in the following way. The weighted sum v is calculated in Mr elementary operations such as:
reading the memory at the address given by the n bits supplied by the multiplexers in the block selected by the content of the counter,
addition of the word read in the memory at this address and of the content of the parallel-parallel register (subtraction for the sign bits),
incrementing the content C of the counter by one unit by a clock pulse,
shifting the series registers and parallel-parallel registers only when content C of the counter reaches M, on counting from 1 to M or M−1 on counting from 0 to M−1.

As the quantities $u_k$ have a low weight at the head, the first quantity calculated with the content of the counter is C=1 is:

$$w(r-1.1) = \sum_{\mu=0}^{n-1} a_{(1+\mu M)} u_{(1+\mu M)}(r-1)$$

then when the content passes to 2:

$$w(r-1.2)+w(r-1.1)$$

and so on until:

$$\sum_{C=1}^{M} w(r-1.C)$$

in which the content reaches M.

There is then a shift of input registers and the output register. The intermediate result is then divided by two, i.e.:

$$2^{-1} \sum_{C=1}^{M} w(r-1.C)$$

to which is added w(r−2.1) then w(r−2.2), etc.

The organization of FIG. 3 has the following disadvantage. It assumes that the number M is an exact power of 2 ($M=2^\beta$). If this is not the case the memory, whose capacity is almost always a power of 2 due to the fact that designers limit themselves to the construction of such memories, is not completely utilized. Thus, with M=3 the counter has $\beta=2$ outputs and the memory has four blocks, one of the four blocks never being selected by the counter because the latter never reaches the value 4 (or 3 on counting from 0 to 2).

The present invention relates to a circuit which solves this problem of optimizing the use of the memory.

The invention is based on the following idea. It is assumed that the content of the counter varies between 0 and M−1 (the reasoning would be similar if the content varied between 1 and M). Thus, the binary configurations corresponding to $M, M+1, \ldots, 2^\beta-1$ are never supplied by the $\beta$ outputs of the counter. This means that certain configurations between 0 and M−1 would be entirely characterized by a number of bits below $\beta$. In other words among the $\beta$ bits supplied by the counter there are bits which may not be significant, i.e. having no influence on the control of the multiplexers and the addressing of the memory.

According to the invention these non-significant bits are not addressed to the memory in such a way that the supplementary inputs are freed and can then be connected to supplementary series registers. Everything takes place in the same way as if the memory had been subdivided into M blocks of not necessarily the same size, but in which all the blocks are used. The increase in the size of the largest blocks compared with the smallest corresponding to the freed supplementary inputs.

It will be shown hereinafter in general manner that the memory can be subdivided into $[M-(2^\beta-M)]$ blocks of $2^n$ words and into $(2^\beta-M)$ blocks of $2^{n+1}$ words and that the number of supplementary registers can reach $(2^\beta-M)$. An appropriate switching means is used for switching the freed memory inputs sometimes to the supplementary series registers and sometimes to the outputs of the counter.

The precise definition of the invention is then as follows. It relates to a digital processing circuit forming a weighted sum of digital signals, comprising n groups of M series registers into which are introduced the signals to be processed, n multiplexers with M inputs and one output, the M inputs of each multiplexer being connected to the outputs of the M series registers of one of the groups, a memory containing the precalculated quantities characteristic of the weighted sum to be formed, said memory having a capacity of $2^{\beta+n}$ words distributed into different blocks, a modulo M counter with $\beta$ outputs, the memory having on the one hand $\beta$ inputs for addressing the different blocks connected to the $\beta$ outputs of the counter and on the other hand n inputs for addressing a word into a block connected to the outputs of the M multiplexers, an adder-subtracter connected to the memory, an accumulator register connected to the adder-subtracter and a clock actuating the counter and the registers, characterized in that the number M is below $2^\beta$, the memory is subdivided into $[M-(2^\beta-M)]$ blocks of $2^n$ words and into $(2^\beta-M)$ blocks of $2^{n+1}$ words, said blocks being selected by the bits supplied to the outputs of the counter, in that it comprises supplementary series registers, whose number is at the most equal to $2^\beta-M$, said series registers receiving the supplementary signals to be processed and in that it also comprises a multiplexing means having inputs connected to the supplementary registers, as well as to those of the outputs of the counter which can supply bits which are not significant with respect to the addressing of the memory blocks, said multiplexing means being controlled by the outputs of the counter indicating the appearance of the non-significant bits, certain of the addressing inputs of the memory blocks being connected to the outputs of said multiplexing means in such a way that they are connected across said multiplexing means either to the supplementary registers when these non-significant bits appear at the output of the counter or to the counter when such bits are absent.

Preferably the multiplexing means is constituted by multiplexers with two inputs and one output.

BRIEF DESCRIPTION OF THE DRAWINGS

The characteristics of the invention can be better gathered from the following description of non-limitative exemplified embodiments with reference to the following drawings.

DESCRIPTION OF THE PREFERRED EMBODIMENTS

Figure 3:
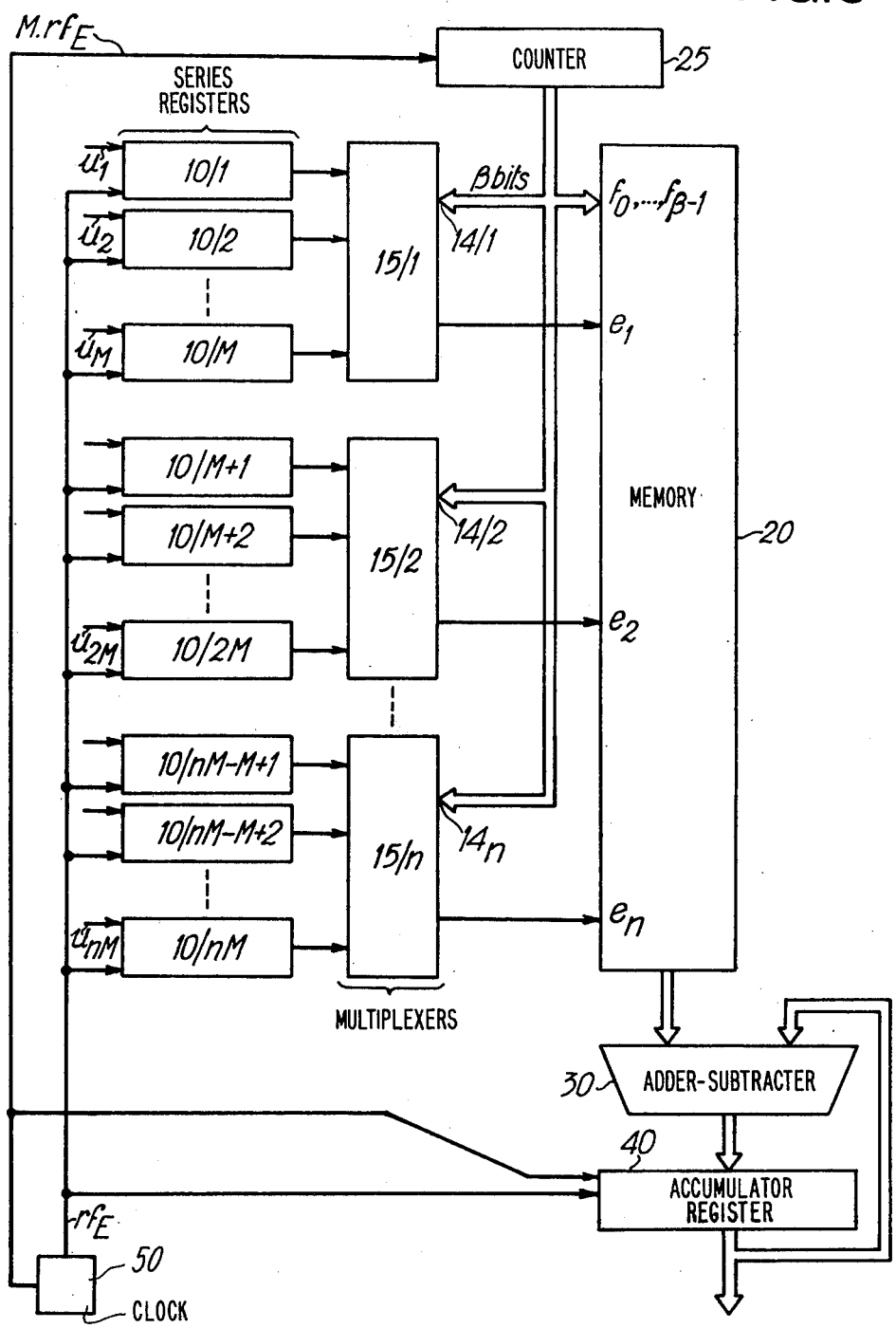
FIG. 3 illustrates an embodiment of the present invention having n multiplexers and nM series registers.
Figure 4:
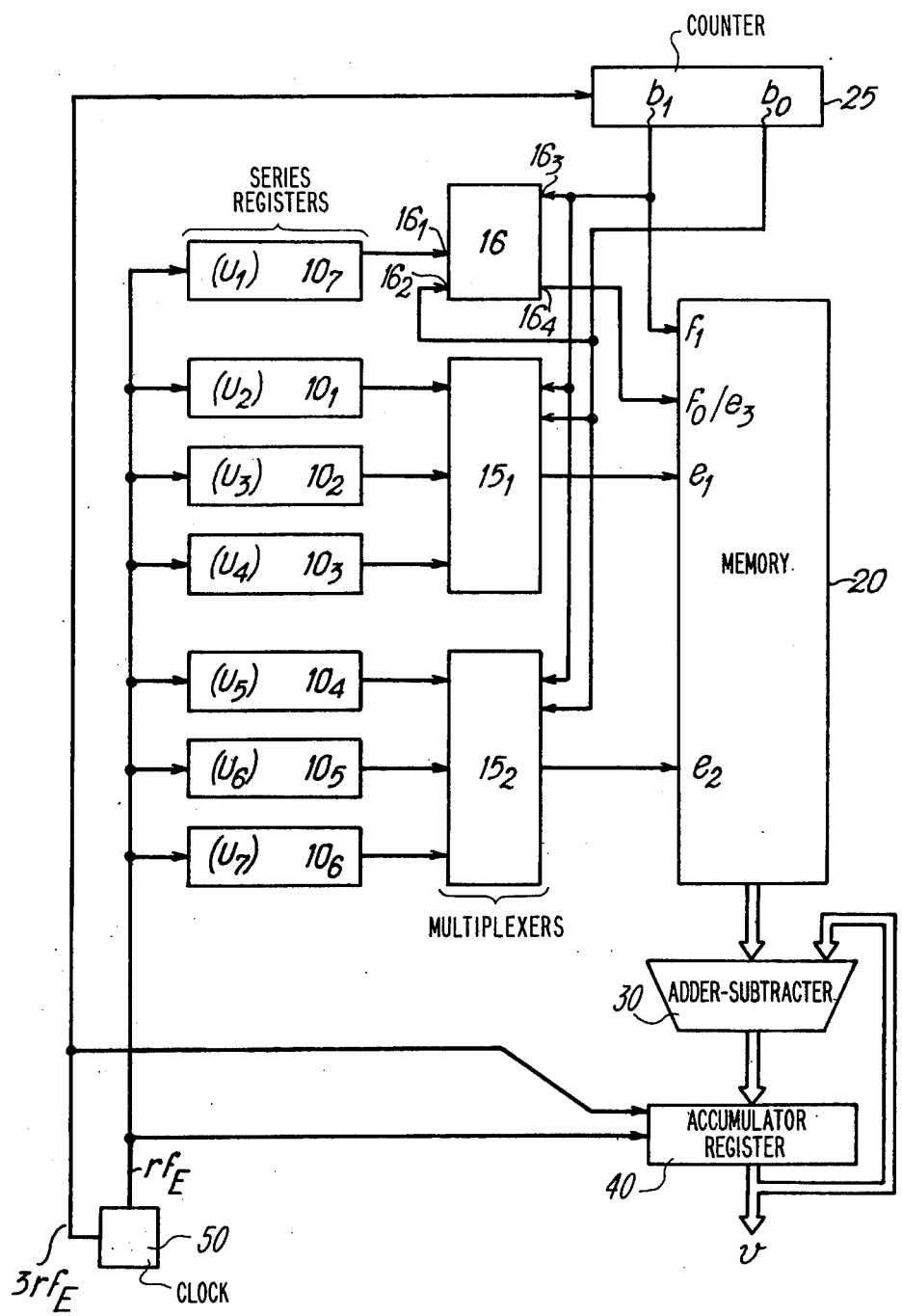
FIG. 4 illustrates a particular embodiment corresponding to $M=3$ and using 7 series registers (one of which is supplementary).

The circuit shown in FIG. 4 comprises elements which have already been shown in general manner in FIG. 3, namely: six series registers 10/1 to 10/6, two multiplexers 15/1 and 15/2 with three inputs and one output (which thus corresponds to $M=3$), a memory 20 with 16 words of m bits allocated to one block of eight words and two blocks of four words. This memory has two addressing inputs $e_1$ and $e_2$ connected to multiplexers 15/1 and 15/2 and two inputs $f_0$ and $f_1$ (the first also being designated by $e_3$ for reasons which will become apparent hereinafter) connected to the two outputs of the modulo 3 counter 25, an adder-subtracter 30, an accumulator register 40 and finally a clock 50.

The circuit also comprises and, in accordance with a feature of the invention, a seventh register 10/7 receiving a seventh signal to be processed, a multiplexer 16 with two signal inputs 16/1 and 16/2, a control input 16/3 and an output 16/4 connected to the input $f_0$ of the memory. The counter supplies two bits $b_0$ (of low weight) and $b_1$ (of high weight) to its two outputs. Bit $b_1$ is applied to the control input 16/3 of multiplexer 16 and to the input $f_1$ of the memory. Bit $b_0$ is applied to the input 16/2 of multiplexer 16. Moreover, bits $b_0$ and $b_1$ are applied to the multiplexers 15/1 and 15/2 which they control.

With the preceding notations the circuit of FIG. 4 thus illustrates the case where $M=3$, $\beta=2$, $n=2$. Its operation is then as follows. Counter 25 counts from 0 to 2. The binary configuration supplied by these outputs are thus as follows:

| $b_1$ | $b_0$ |
|---|---|
| 0 | 0 |
| 0 | 1 |
| 1 | 0 |

The binary configuration 11 is never produced because the content of the counter does not reach 3. Thus, if $b_1$ is at 1 the least significant bit $b_0$ is not significant because for it alone $b_1=1$ is sufficient for addressing one of the blocks of the memory and for controlling the multiplexers 15/1 and 15/2, bit $b_0$ not being involved in this addressing and this control. It is thus possible to free a supplementary memory input when $b_1=1$ and allocate this input to an input register, making it possible to form a memory block of twice the size. This switching is obtained by multiplexer 16. Output 16/4 of this element is connected to input 16/1 when bit $b_1$ applied to 16/3 is 1. It is connected to 16/2 when this bit is at 0. Moreover, the output of multiplexer 16 is connected to the input $f_0/e_3$ of the memory. Thus, this input is connected either to the seventh register 10/7 when $b_1=1$ or to counter 25 when $b_1=0$, which explains its double notation. At the same time bit $b_1=1$ applied to the input $f_1$ selects the block of eight words of the memory, one word of this block being addressed by the three bits applied at $e_1$, $e_2$ and $e_3$. When $b_1$ is at 0, the bit $b_0$ is applied to the input $f_0$ of the memory across multiplexer 16 and it selects one or other (as a function of whether it is at 0 or 1) of the two memory blocks of four words and these memory blocks in each case work with the two inputs $e_1$ and $e_2$. The 16 words of the memory are consequently all used.

It is apparent from this example that bit $b_0$ only has significance with regards to the selection of a memory block when bit $b_1$ is not at 1. In the opposite case bit $b_0$ does not participate in the selection of a memory block and this function is exclusively performed by bit $b_1$. It is in this connection that it is stated that this bit is sometimes "non-significant".

In the example of FIG. 4 the memory of $2^4$ words is subdivided into a block of $2^3$ words and two blocks of $2^2$ words, i.e., whilst using the already used notation n (with $n=2$) into a block of $2^{n+1}$ words and into two blocks of $2^n$ words.

It can be shown that this is the general way of organizing the memory. In actual fact a memory of $2^{\beta+n}$ words can be subdivided into memories of $2^n$ words and into memories of $2^{n+1}$ words, which is obtained from the equation:

$$2^{\beta+n}=[M-(2^\beta-M)]2^n+(2^\beta-M)2^{n+1}$$

which can be immediately demonstrated. In this equation the square-bracketed term proves the inequations:

$$0<M-(2^\beta-M)\leq 2^\beta$$

and the round-bracketed term the inequation $2^\beta-M\geq 0$ because $2^{\beta-1}<M\leq 2^\beta$. This means that the memory of $2^{+n}$ words can be subdividd into $M-(2^\beta-M)$ blocks of size $2^n$ and into $(2^\beta-M)$ blocks of size $2^{n+1}$.

In general terms and in accordance with the invention it is possible to free $(2^\beta-M)$ supplementary inputs, which raises the possible number of inputs p to:

$$p_{max} = nM + 2 - M \quad (12)$$

for $2^{\beta-1} < M \leq 2^{\beta}$.

If M is equal to the power $\beta$ of 2, the number of supplementary inputs drops to zero, because the case of FIG. 3 is found again. The following table illustrates different cases for all the values of M between 2 and 8.

| M | $\beta$ | $p_{max}$ | Memory Capacity | Number of clock strokes |
|---|---|---|---|---|
| 2 | 1 | 2n | $2^{n+1}$ | 2r |
| 3 | 2 | 3n + 1 | $2^{n+2}$ | 3r |
| 4 | 2 | 4n | $2^{n+2}$ | 4r |
| 5 | 3 | 5n + 3 | $2^{n+3}$ | 5r |
| 6 | 3 | 6n + 2 | $2^{n+3}$ | 6r |
| 7 | 3 | 7n + 1 | $2^{n+3}$ | 7r |
| 8 | 3 | 8n | $2^{n+3}$ | 8r |

This table shows that as a function of the number in inputs p and for a given memory size several different solutions are possible. In practice that leading to the smallest number of clock strokes is chosen.

EXAMPLES (1) p=4 can be obtained with:
  M=2 and n=2
  M=3 and n=1
  M=4 and n=1
for a memory capacity of eight words of m bits.

The minimum number of clock strokes is obtained with the first solution.

(2) p=7 can be obtained with:
  M=3 and n=2
  M=4 and n=2
  M=5 and n=1
  M=6 and n=1
  M=7 and n=1
  M=8 and n=1
for a memory capacity of 16 words of m bits.

The minimum number of clock strokes is obtained with the first solution.

Figure 5:
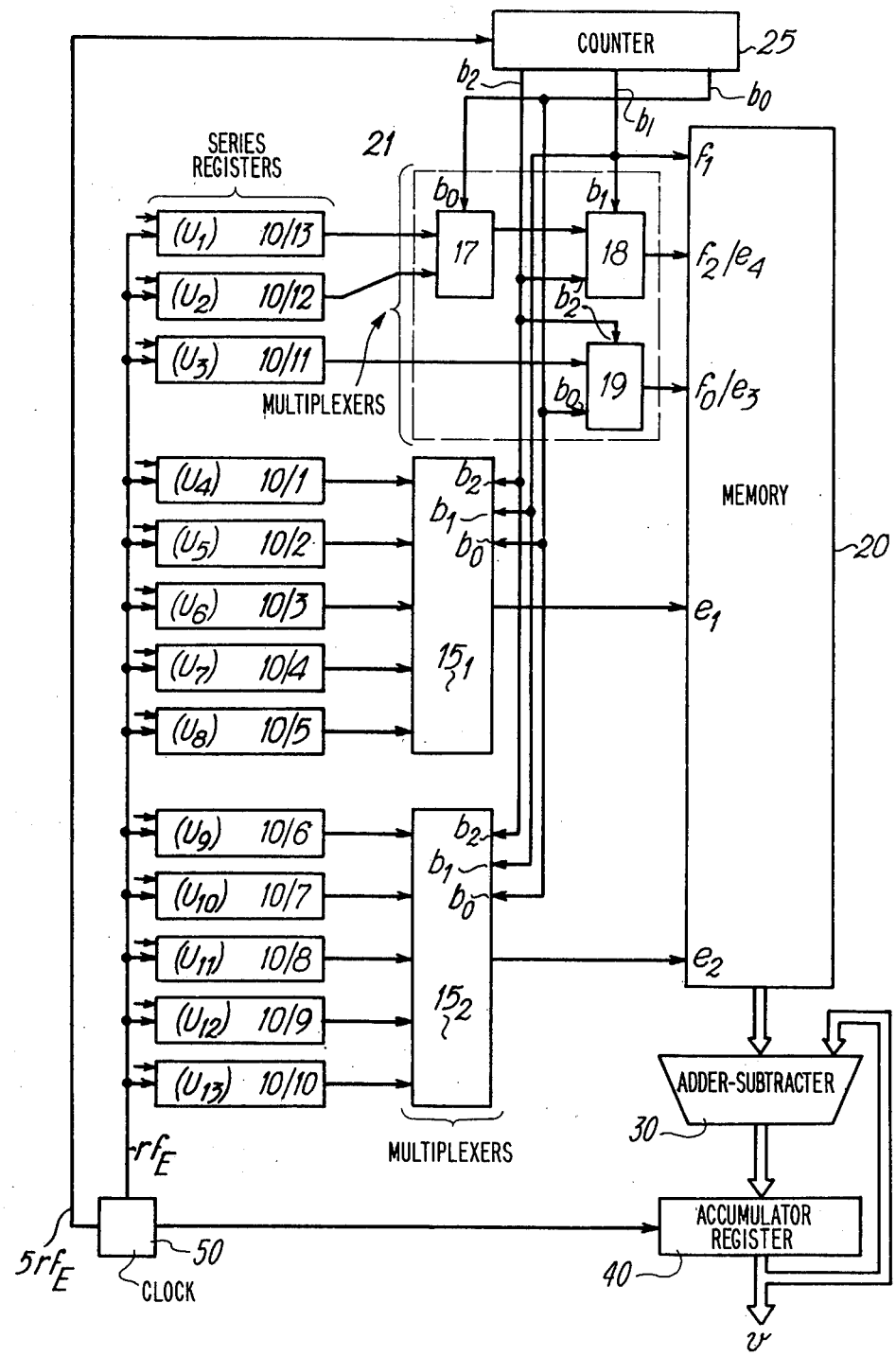
FIG. 5 illustrates another special embodiment, corresponding to $M=5$ and using 13 series registers (three of which are supplementary).

FIG. 5 shows another embodiment corresponding to the following case: p=13, n=5, $\beta=3$, $2^{\beta}=8$ and n=2.

Compared with the previously illustrated case the following differences occur. Firstly multiplexers 15/1 and 15/2 have five instead of three inputs, counter 25 is modulo 5 instead of 3 and has three outputs instead of two, which supply three bits $b_0$, $b_1$ and $b_2$ and there are three supplementary registers 10/11, 10/12 and 10/13. Furthermore, the multiplexing means 14 is now constituted by three multiplexers 2→1, respectively 17, 18 and 19, respectively controlled by bits $b_0$, $b_1$ and $b_2$. The two multiplexers 17 and 18 perform two multplexing stages making it possible to address to input $f_2/e_4$ of the memory either bit $b_2$ or any one of the outputs of supplementary registers 10/12 and 10/13.

The circuit operates in the following way. The content of the counter passes from 0 to 4 and supplies the following binary configurations:

| $b_2$ | $b_1$ | $b_0$ |
|---|---|---|
| 0 | 0 | 0 |
| 0 | 0 | 1 |
| [0] | 1 | 0 |
| [0] | 1 | 1 |
| 1 | [0] | [0] |

When bit $b_2$ is at 1, bits $b_1$ and $b_0$ are not significant. When bit $b_1$ is at 1, bit $b_2$ is not significant, which applies twice in succession. It would them seem that it was possible to free four supplementary bits instead of the three envisaged hereinbefore. However, in actual fact it is not possible to independently use all these supplementary inputs. This point appears on subdividing the memory into five blocks:

1st block: size 4 words, corresponds to address 000
  2nd block: size 4 words, corresponds to address 001
  3rd block: size 8 words, corresponds to addresses 010 and 110
  4th block: size 8 words, corresponds to addresses 011 and 111
  5th block: size 8 words, corresponds to addresses 100 and 101

Addresses 110 and 111 are already used in the third and fourth blocks and cannot be reused in the fifth block.

The total size of the memory is consequently 32 words, i.e. $2^{\beta+n} = 2^5$.

Figure 1:
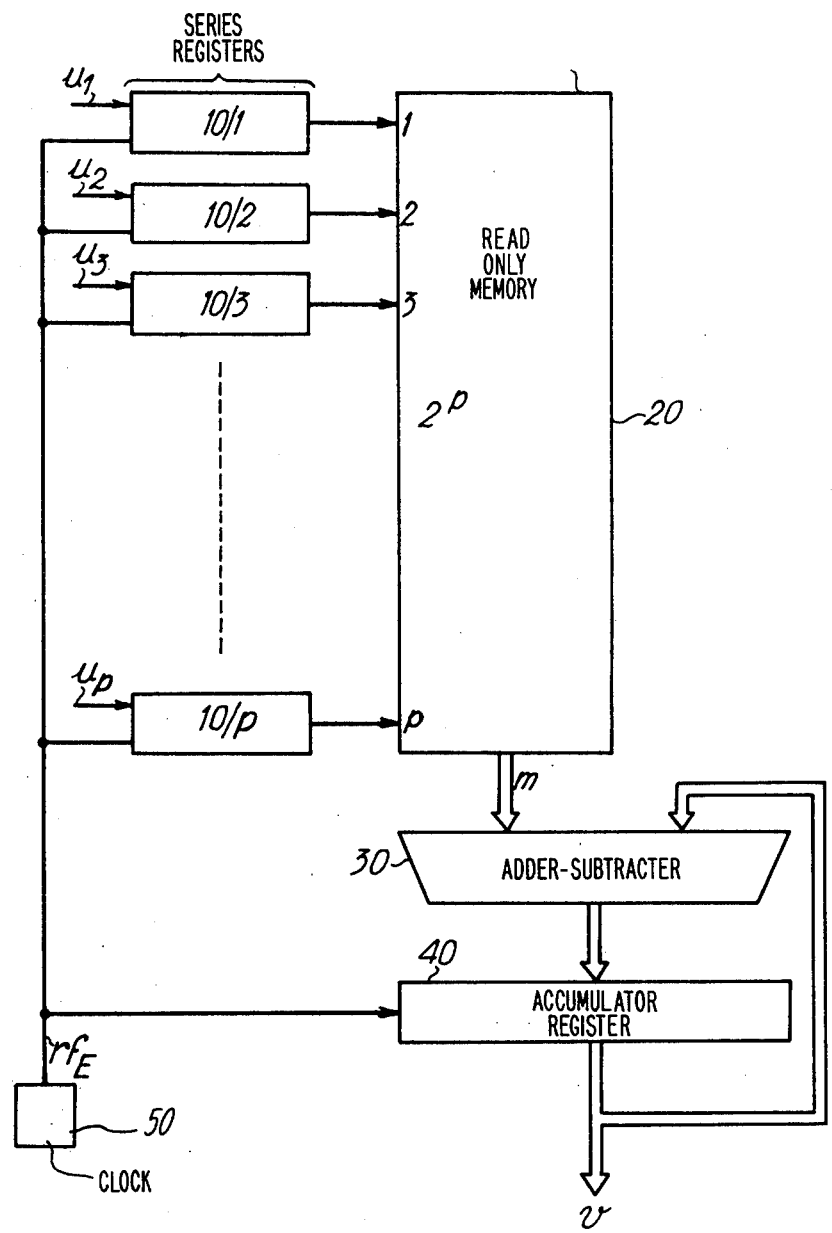
FIG. 1 illustrates a first prior art embodiment of a distributed arithmetic digital processing circuit having p series registers.

Naturally, in a circuit like that of FIG. 1 multiplexing means other than the three multiplexers 2→1 could be used to obtain the result, e.g. two multiplexers 2→1 each located at the output of one of the registers 10/12 or 10/13 or one multiplexer with three inputs connected to 10/12, 10/13 and $b_2$, etc. In general terms and as stated in the definition of the invention it is advantageous to use a multiplexing means able to connect the freed inputs of the memory either to the supplementary registers when the non-significant bits appear at the counter output or to the counter in the absence of such bits.

On the basis of the two examples described corresponding to M=3 and M=5 it is easily possible to continue this reasoning:

For M=6, the content of the counter passing from 0 to 5 and the counter supplying the configurations:

| 0 | 0 | 0 |
|---|---|---|
| 0 | 0 | 1 |
| [0] | 1 | 0 |
| [0] | 1 | 1 |
| 1 | 0 | 0 |
| 1 | 0 | 1 | in which the non-significant bits are framed and it is possible to free two supplementary inputs corresponding to these bits.

For M=7, the conter content passing from 0 to 6 and the counter supplies the configurations:

| 0 | 0 | 0 |
|---|---|---|
| 0 | 0 | 1 |
| 0 | 1 | 0 |
| 0 | 1 | 1 |
| 1 | 0 | 0 |
| 1 | 0 | 1 |

-continued

| 1 | 1 | 0 |
|---|---|---| and it is possible to free one supplementary input corresponding to the single framed insignificant bit.

Figure 2:
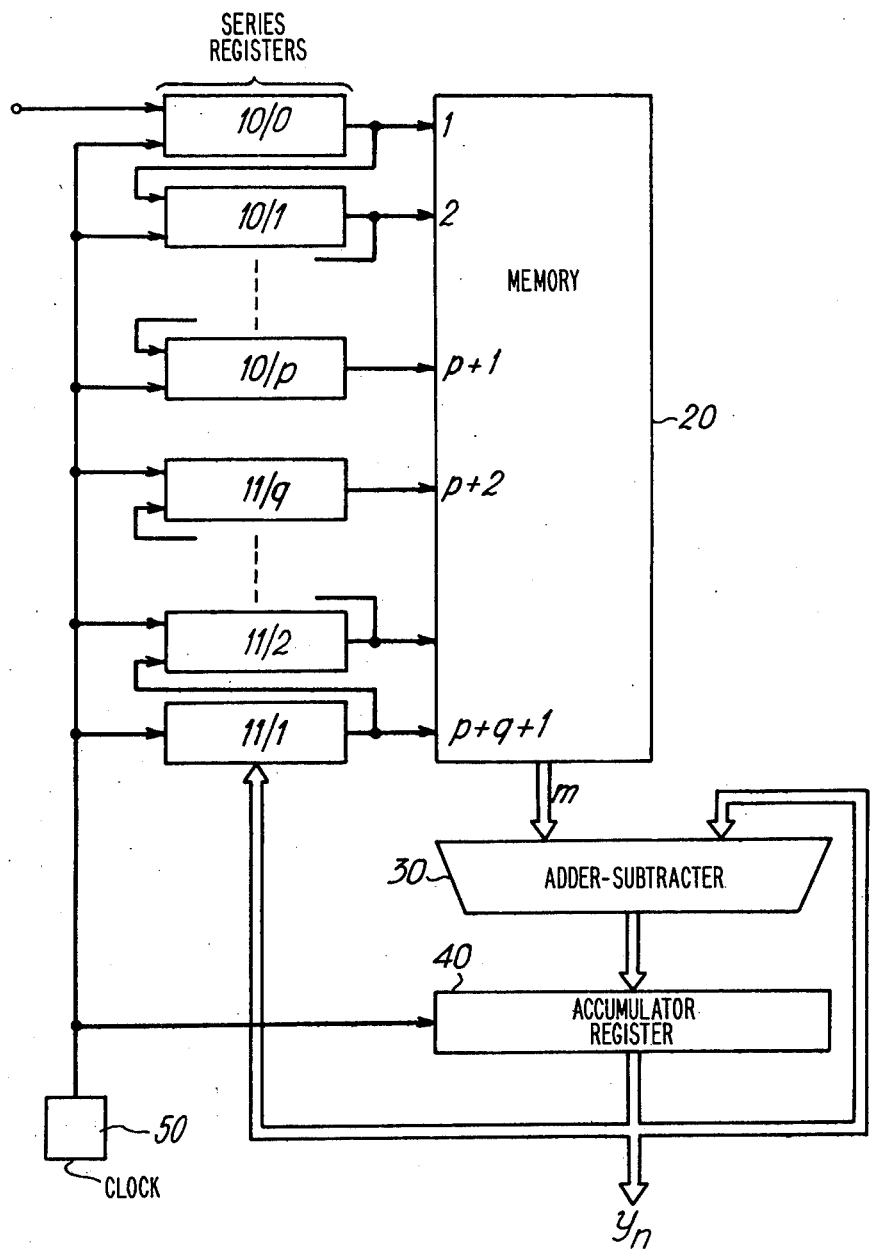
FIG. 2 illustrates a second prior art embodiment of a distributed arithmetic digital processing curcuit having $p+q+1$ series registers.

The above description relates to a circuit performing a weighted sum. As has been shown by FIGS. 1 and 2 the application to the production of a recursive filter is immediate. To this end it is merely necessary to connect the series registers in cascade with a parallel loading of the first register of the recursive part (11/1 in FIG. 2).

This filter can also be of the oversampling type as described in French Patent Application EN 80 18 580 filed by the same applicants and entitled "Recursive oversampling filter in distributed arithmetic".

We claim:

1. A digital processing circuit forming a weighted sum of digital signals, comprising n groups each of M series registers into which are introduced signals to be processed, n multiplexers each with M inputs and one output, said M inputs of each multiplexer being connected to the outputs of said M series registers of one of the groups, a memory containing precalculated quantities characteristic of the weighted sum to be formed, said memory having a capacity of $2^{\beta+n}$ words distributed into different blocks, a modulo M counter with $\beta$ outputs, said memory having $\beta$ inputs for addressing the different blocks ($f_0, f_1 \ldots, f_{\beta-1}$) connected to the $\beta$ outputs of said counter and n inputs for addressing a word into a block ($e_1, e_2 \ldots e_n$) connected to the outputs of the n multiplexers, an adder-subtracter connected to said memory, an accumulator register connected to said adder-subtracter and a clock actuating said counter, said series registers and said accumulator register, the number M being less than $2^\beta$, said memory being subdivided into $M-(2^\beta-M)$ blocks each of $2^n$ words and into $(2^\beta-M)$ blocks each of $2^{n+1}$ words, said blocks being selected by the bits supplied by the outputs of said counter, said digital processing circuit comprising supplementary series registers, whose number is at the most equal to $2^\beta-M$, said supplementary series registers receiving supplementary signals to be processed, said digital processing circuit also comprising a multiplexing means having inputs connected to the outputs of said supplementary series registers, as well as to the outputs of said counter which can supply bits which are not significant with respect to the addressing of the memory blocks, said multiplexing means being controlled by the outputs of said counter indicating the appearance of the non-significant bits, certain of the addressing inputs of the memory blocks being connected to the outputs of said multiplexing means in such a way that they are connected across said multiplexing means either to said supplementary series registers when these non-significant bits appear at the output of said counter or to said counter when such bits are absent.

2. A circuit according to claim 1, wherein said multiplexing means is consituted by at least one multiplexer with two inputs and one output.

3. A circuit according to claim 1, wherein the weighted sum produced corresponds to recursive filtering, said series registers being interconnected in cascade, and one register having parallel loading from said accumulator register.

* * * * *